United States Patent
Park et al.

(10) Patent No.: US 10,147,774 B2
(45) Date of Patent: Dec. 4, 2018

(54) METHOD OF MANUFACTURING THIN FILM TRANSISTOR, THIN FILM TRANSISTOR MANUFACTURED BY USING THE METHOD, METHOD OF MANUFACTURING ORGANIC LIGHT-EMITTING DISPLAY APPARATUS, AND ORGANIC LIGHT-EMITTING DISPLAY APPARATUS MANUFACTURED BY USING THE METHOD

(71) Applicant: Samsung Display Co., Ltd., Yongin, Gyeonggi-Do (KR)

(72) Inventors: Byoung-Keon Park, Yongin (KR); Jong-Ryuk Park, Yongin (KR); Dong-Hyun Lee, Yongin (KR); Jin-Wook Seo, Yongin (KR); Ki-Yong Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/307,980

(22) Filed: Jun. 18, 2014

(65) Prior Publication Data

US 2014/0299860 A1 Oct. 9, 2014

Related U.S. Application Data

(62) Division of application No. 13/200,383, filed on Sep. 23, 2011, now Pat. No. 8,791,032.

(30) Foreign Application Priority Data

Jun. 13, 2011 (KR) .................. 10-2011-0057005

(51) Int. Cl.
*H01L 27/32* (2006.01)
*H01L 29/786* (2006.01)
(Continued)

(52) U.S. Cl.
CPC ...... *H01L 27/3244* (2013.01); *H01L 27/1288* (2013.01); *H01L 27/3258* (2013.01);
(Continued)

(58) Field of Classification Search
CPC ......... H01L 21/823431; H01L 27/0886; H01L 27/0924; H01L 29/1037; H01L 29/66795;
(Continued)

(56) References Cited

U.S. PATENT DOCUMENTS 5,120,667 A * 6/1992 Tarui ................. H01L 21/32137
257/66
6,188,108 B1 * 2/2001 Yoon ................. H01L 29/42384
257/347

(Continued)

FOREIGN PATENT DOCUMENTS

| CN | 101330004 A | 12/2008 |
| CN | 101546782 A | 9/2009 |

(Continued)

OTHER PUBLICATIONS

Taiwan Office Action dated Sep. 24, 2015 for Taiwan patent application No. 100139224 and Request for Entry of the Accompanying Office Action attached herewith.

(Continued)

*Primary Examiner* — Yu Chen
(74) *Attorney, Agent, or Firm* — H.C. Park & Associates, PLC

(57) ABSTRACT

A method of manufacturing a thin film transistor (TFT) comprises forming a buffer layer, an amorphous silicon layer, and an insulating layer on a substrate; crystallizing the amorphous silicon layer as a polycrystalline silicon layer; forming a semiconductor layer and a gate insulating layer which have a predetermined shape by simultaneously pat- (Continued)

terning the polycrystalline silicon layer and the insulating layer; forming a gate electrode including a first portion and a second portion by forming and patterning a metal layer on the gate insulating layer. The first portion is formed on the gate insulating layer and overlaps a channel region of a semiconductor layer, and the second portion contacts the semiconductor layer. A source region and a drain region are formed on the semiconductor layer by doping a region of the semiconductor layer. The region excludes the channel region overlapping the gate electrode and constitutes a region which does not overlap the gate electrode. An interlayer insulating layer is formed on the gate electrode so as to cover the gate insulating layer; contact holes are formed on the interlayer insulating layer and the gate insulating layer so as to expose the source region and the drain region, and simultaneously an opening for exposing the second portion is formed. A source electrode and a drain electrode are formed by patterning a conductive layer on the interlayer insulating layer. The source electrode and the drain electrode are electrically connected to the source region and the drain region via the contact holes, and simultaneously the second portion exposed via the opening is removed.

8 Claims, 10 Drawing Sheets

(51) Int. Cl.
H01L 29/06 (2006.01)
H01L 29/08 (2006.01)
H01L 29/417 (2006.01)
H01L 29/423 (2006.01)
H01L 27/12 (2006.01)
H01L 29/49 (2006.01)
H01L 29/66 (2006.01)

(52) U.S. Cl.
CPC ...... *H01L 29/0657* (2013.01); *H01L 29/0847* (2013.01); *H01L 29/41733* (2013.01); *H01L 29/42384* (2013.01); *H01L 29/4908* (2013.01); *H01L 29/66757* (2013.01); *H01L 29/78606* (2013.01); *H01L 29/78675* (2013.01); *H01L 29/78696* (2013.01); H01L 27/3262 (2013.01); H01L 2029/42388 (2013.01)

(58) Field of Classification Search
CPC ......... H01L 29/785; H01L 2029/42388; H01L 29/0657; H01L 29/0847; H01L 29/1033; H01L 29/41733; H01L 29/42364; H01L 29/78696; H01L 29/66757; H01L 29/78675; H01L 29/78666; H01L 27/1214; H01L 27/1248; H01L 27/3258; H01L 29/66772; H01L 29/78654; H01L 29/78618; H01L 29/4236

See application file for complete search history.

(56) References Cited

U.S. PATENT DOCUMENTS

| | | | |
|---|---|---|---|
| 6,316,294 B1 | 11/2001 | Yoon et al. | |
| 6,528,843 B1 * | 3/2003 | Wu | G11C 16/0425 257/315 |
| 8,101,952 B2 | 1/2012 | Park et al. | |
| 2002/0192885 A1* | 12/2002 | Miyasaka | H01L 29/66757 438/164 |
| 2003/0042542 A1* | 3/2003 | Maegawa | H01L 21/28008 257/347 |
| 2004/0135180 A1* | 7/2004 | Makita | H01L 21/2022 257/285 |
| 2008/0135838 A1* | 6/2008 | Park | H01L 29/4908 257/40 |
| 2008/0315207 A1 | 12/2008 | Yang et al. | |
| 2009/0029739 A1* | 1/2009 | Okamoto | G02F 1/13338 455/566 |
| 2009/0242895 A1* | 10/2009 | Park | H01L 29/66757 257/72 |
| 2009/0256469 A1 | 10/2009 | Park et al. | |
| 2010/0224881 A1 | 9/2010 | Park et al. | |
| 2015/0255282 A1 | 9/2015 | Lee et al. | |

FOREIGN PATENT DOCUMENTS

| | | |
|---|---|---|
| JP | 5399298 | 1/2014 |
| KR | 10-0282233 | 11/2000 |
| KR | 10-2004-0067513 | 7/2004 |
| KR | 10-2006-0113585 | 11/2006 |
| KR | 10-2009-0036872 | 4/2009 |
| KR | 10-2009-0103009 | 10/2009 |
| KR | 10-2009-0108416 | 10/2009 |
| KR | 10-2011-0056084 | 5/2011 |

OTHER PUBLICATIONS

Chinese Office Action issued by Chinese Patent Office dated Dec. 18, 2015 in connection with Chinese Patent Application No. 201210014755.8 and Request for Entry attached herewith.
Chinese Granted Document issued by Chinese Patent Office dated Mar. 1, 2017 in connection with Chinese Patent Application No. 201210014755.8 and Request for Entry attached herewith.
Notice of Allowance dated Feb. 28, 2018, in Korean Patent Application No. 10-2011-0057005.
Office Action dated Aug. 18, 2017, in Korean Patent Application No. 10-2011-0057005.

* cited by examiner

METHOD OF MANUFACTURING THIN FILM TRANSISTOR, THIN FILM TRANSISTOR MANUFACTURED BY USING THE METHOD, METHOD OF MANUFACTURING ORGANIC LIGHT-EMITTING DISPLAY APPARATUS, AND ORGANIC LIGHT-EMITTING DISPLAY APPARATUS MANUFACTURED BY USING THE METHOD

CLAIM OF PRIORITY

This application makes reference to, incorporates the same herein, and claims all benefits accruing under 35 U.S.C. § 119 from an application earlier filed in the Korean Intellectual Property Office on the 13 Jun. 2011 and there duly assigned Serial No. 10-2011-0057005. Furthermore, this application is filed pursuant to 35 U.S.C. § 121 as a Divisional application of Applicants' patent application Ser. No. 13/200,383 filed in the U.S. Patent & Trademark Office on 23 Sep. 2011 (Now U.S. Pat. No. 8,791,032 issued Jul. 29, 2014), and assigned to the assignee of the present invention. All benefits accruing under 35 U.S.C. § 120 from the aforesaid present application Ser. No. 13/200,383 are also claimed.

BACKGROUND OF THE INVENTION

Field of the Invention

The present invention relates to a method of manufacturing a thin film transistor (TFT) having a uniform characteristic, a TFT manufactured by using the method, a method of manufacturing an organic light-emitting display apparatus, and an organic light-emitting display apparatus manufactured by using the method of manufacturing the organic light-emitting display apparatus.

Description of the Related Art

In general, a thin film transistor (TFT) including a polycrystalline silicon layer is characterized by its excellent electron mobility and its ability to configure a complementary metal-oxide-semiconductor (CMOS) circuit, and thus the TFT is used in the switching device of a high-definition (HD) display panel, a projection panel requiring a high amount of light, or the like.

According to the related art, a TFT is manufactured in such a manner that an amorphous silicon layer is formed on a substrate, the amorphous silicon layer is crystallized as a polycrystalline silicon layer, and then the polycrystalline silicon layer is patterned to have a predetermined shape, so that a semiconductor layer is formed. Afterward, a gate insulating layer is formed so as to completely cover the semiconductor layer, and a gate electrode is formed on the gate insulating layer.

However, according to the related art, the crystallization process is performed while the amorphous silicon is exposed to the air. Also, in the process in which the polycrystalline silicon layer is patterned so as to have the predetermined shape, the polycrystalline silicon layer contacts photoresist (PR). In this regard, contamination may occur in the amorphous silicon layer or the polycrystalline silicon layer in the crystallization process and the patterning process so that the TFT does not exhibit a uniform characteristic but has a distribution of characteristics.

SUMMARY OF THE INVENTION

The present invention provides a method of manufacturing a thin film transistor (TFT) by simultaneously forming a buffer layer and an insulating layer when an amorphous silicon layer is formed, and then simultaneously patterning a semiconductor layer and a gate insulating layer; a TFT manufactured by using the method; a method of manufacturing an organic light-emitting display apparatus; and an organic light-emitting display apparatus manufactured by using the method of manufacturing the organic light-emitting display apparatus.

According to an aspect of the present invention, a method of manufacturing a thin film transistor (TFT) may include the steps of forming a buffer layer, an amorphous silicon layer, and an insulating layer on a substrate; crystallizing the amorphous silicon layer as a polycrystalline silicon layer; forming a semiconductor layer and a gate insulating layer which have a predetermined shape by simultaneously patterning the polycrystalline silicon layer and the insulating layer; forming a gate electrode, including a first portion and a second portion, by forming and patterning a metal layer on the gate insulating layer, wherein the first portion is formed on the gate insulating layer and overlaps a channel region of a semiconductor layer, and wherein the second portion contacts the semiconductor layer; forming a source region and a drain region on the semiconductor layer by performing doping on a region of the semiconductor layer, wherein the region excludes the channel region overlapping the gate electrode and indicates a region which does not overlap the gate electrode; forming an interlayer insulating layer on the gate electrode so as to cover the gate insulating layer; forming contact holes on the interlayer insulating layer and the gate insulating layer so as to expose the source region and the drain region, and simultaneously forming an opening for exposing the second portion; and forming a source electrode and a drain electrode by forming and patterning a conductive layer on the interlayer insulating layer, wherein the source electrode and the drain electrode are electrically connected to the source region and the drain region, respectively, via the contact holes, and simultaneously removing the second portion exposed via the opening.

The step of forming the buffer layer, the amorphous silicon layer, and the insulating layer on the substrate may be performed via one process.

The amorphous silicon layer may be crystallized as the polycrystalline silicon layer by using one of a solid phase crystallization (SPC) method, a metal induced crystallization (MIC) method, a super grain silicon (SGS) crystallization method, and a Joule-heating induced crystallization (JIC) method.

The method may further include the step of forming a metal catalyst layer on the buffer layer, and the amorphous silicon layer may be crystallized as the polycrystalline silicon layer by performing a thermal treatment.

The second portion may indicate a width portion of the gate electrode which is greater than a width of the semiconductor layer in a direction perpendicular to a movement direction of electrons or holes in the semiconductor layer, and which contacts the semiconductor layer.

The second portion may also contact the gate insulating layer.

The step of removing the second portion may include the steps of removing the second portion together with a portion of the semiconductor layer which contacts the second portion, and removing a portion of the gate insulating layer which contacts the second portion, and the buffer layer may be exposed via a region where the second portion, the portion of the semiconductor layer, and the portion of the gate insulating layer have been removed.

The opening may be formed on the interlayer insulating layer corresponding to the second portion.

The buffer layer may include at least one material selected from the group consisting of silicon oxide, silicon nitride, and silicon oxynitride.

According to another aspect of the present invention, a thin film transistor (TFT) may include a substrate; a buffer layer disposed on the substrate; a semiconductor layer disposed on the buffer layer and including a channel region, and source and drain regions formed by having the channel region arranged therebetween, wherein a width of the channel region with respect to a direction perpendicular to a movement direction of electrons or holes is less than a width of the source region or a width of the drain region; a gate insulating layer patterned on the semiconductor layer so as to have the same shape as the semiconductor layer; a gate electrode formed on the gate insulating layer so as to correspond to the channel region; an interlayer insulating layer formed on the gate insulating layer so as to cover the gate electrode; and a source electrode and a drain electrode disposed on the interlayer insulating layer and electrically connected to the source region and the drain region, respectively.

The buffer layer may include at least one material selected from the group consisting of silicon oxide, silicon nitride, and silicon oxynitride.

According to another aspect of the present invention, a method of manufacturing an organic light-emitting display apparatus may include the steps of forming a buffer layer, an amorphous silicon layer, and an insulating layer on a substrate; crystallizing the amorphous silicon layer as a polycrystalline silicon layer; forming a semiconductor layer and a gate insulating layer which have a predetermined shape by simultaneously patterning the polycrystalline silicon layer and the insulating layer; forming a gate electrode including a first portion and a second portion by forming and patterning a metal layer on the gate insulating layer, wherein the first portion is formed on the gate insulating layer and overlaps a channel region of a semiconductor layer, and wherein the second portion contacts the semiconductor layer; forming a source region and a drain region on the semiconductor layer by performing doping on a region of the semiconductor layer, wherein the region excludes the channel region overlapping the gate electrode and indicates a region which does not overlap the gate electrode; forming an interlayer insulating layer on the gate electrode so as to cover the gate insulating layer; forming contact holes on the interlayer insulating layer and the gate insulating layer so as to expose the source region and the drain region, and simultaneously forming an opening for exposing the second portion; forming a source electrode and a drain electrode by forming and patterning a conductive layer on the interlayer insulating layer, wherein the source electrode and the drain electrode are electrically connected to the source region and the drain region, respectively, via the contact holes, and simultaneously removing the second portion exposed via the opening; forming a planarization layer on the interlayer insulating layer so as to cover the source electrode and the drain electrode; forming a via hole on the planarization layer so as to expose the source electrode or the drain electrode; forming a pixel electrode on the planarization layer, wherein the pixel electrode is electrically connected to the source electrode or the drain electrode via the via hole; forming an intermediate layer including an emission layer (EML) on the pixel electrode; and forming an opposite electrode on the intermediate layer.

The step of forming the buffer layer, the amorphous silicon layer, and the insulating layer on the substrate may be performed via one process.

The amorphous silicon layer may be crystallized as the polycrystalline silicon layer by using one of a solid phase crystallization (SPC) method, a metal induced crystallization (MIC) method, a super grain silicon (SGS) crystallization method, and a Joule-heating induced crystallization (JIC) method.

The method may further include the step of forming a metal catalyst layer on the buffer layer, and the amorphous silicon layer may be crystallized as the polycrystalline silicon layer by performing a thermal treatment.

The second portion may indicate a width portion of the gate electrode which is greater than a width of the semiconductor layer in a direction perpendicular to a movement direction of electrons or holes in the semiconductor layer, and which contacts the semiconductor layer.

The second portion may also contact the gate insulating layer.

The step of removing the second portion may include the step of removing the second portion, together with a portion of the semiconductor layer which contacts the second portion and a portion of the gate insulating layer which contacts the second portion, and the buffer layer may be exposed via a region where the second portion, the portion of the semiconductor layer, and the portion of the gate insulating layer have been removed.

The planarization layer may also be formed on the buffer layer exposed via the region.

The opening may be formed on the interlayer insulating layer corresponding to the second portion.

The buffer layer may include at least one material selected from the group consisting of silicon oxide, silicon nitride, and silicon oxynitride.

The method may further include the step of forming a pixel defining layer (PDL) on the planarization layer so as to cover side edges of the pixel electrode.

According to another aspect of the present invention, an organic light-emitting display apparatus may include a substrate; a buffer layer disposed on the substrate; a semiconductor layer disposed on the buffer layer and including a channel region, and source and drain regions formed by having the channel region arranged therebetween, wherein a width of the channel region with respect to a direction perpendicular to a movement direction of electrons or holes is less than a width of the source region or a width of the drain region; a gate insulating layer patterned on the semiconductor layer so as to have the same shape as the semiconductor layer; a gate electrode formed on the gate insulating layer so as to correspond to the channel region; an interlayer insulating layer formed on the gate insulating layer so as to cover the gate electrode; a source electrode and a drain electrode disposed on the interlayer insulating layer and electrically connected to the source region and the drain region, respectively; a planarization layer formed on the interlayer insulating layer so as to cover the source electrode and the drain electrode; a pixel electrode disposed on the planarization layer and electrically connected to the source electrode or the drain electrode; an intermediate layer disposed on the pixel electrode and including an emission layer (EML); and an opposite electrode disposed on the intermediate layer.

The buffer layer may include at least one material selected from the group consisting of silicon oxide, silicon nitride, and silicon oxynitride.

The organic light-emitting display apparatus may further include a pixel defining layer (PDL) disposed on the planarization layer so as to cover side edges of the pixel electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
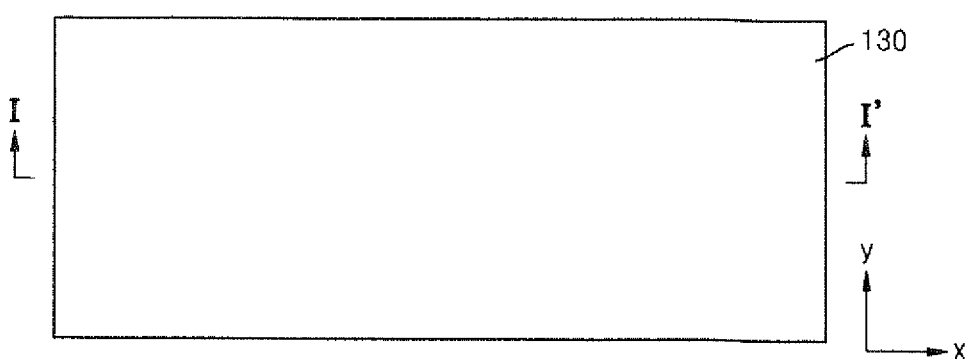
FIGS. 1A, 1B, 2A, 2B, 3A through 3C, 4A through 4C, 5A through 5C, 6A through 6C, and 7A through 7C are cross-sectional views which schematically illustrate a method of manufacturing a thin film transistor (TFT) according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutions which do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural unless it has a clearly different meaning in the context. In the present specification, it is to be understood that terms, such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items.

Hereinafter, the present invention will be described in detail by explaining exemplary embodiments of the invention with reference to the attached drawings.

FIGS. 1A, 1B, 2A, 2B, 3A through 3C, 4A through 4C, 5A through 5C, 6A through 6C, and 7A through 7C are cross-sectional views which schematically illustrate a method of manufacturing a thin film transistor (TFT) TR according to an embodiment of the present invention.

Figure 1B:
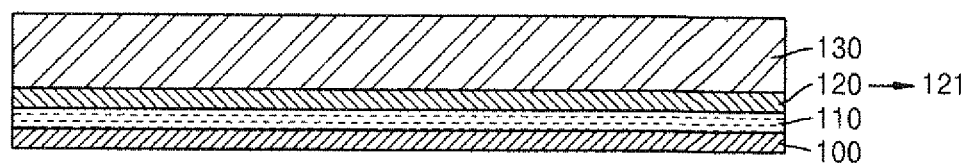

Referring to FIGS. 1A and 1B, a buffer layer 110, an amorphous silicon layer 120, and an insulating layer 130 are formed on a substrate 100 via one process. Afterward, the amorphous silicon layer 120 is crystallized as a polycrystalline silicon layer 121.

The substrate 100 may be formed of a transparent glass material containing $SiO_2$ as a main component, but it is not limited thereto.

The buffer layer 110 functions to prevent penetration of impurities and to planarize a surface. Also, the buffer layer 110 functions to protect one surface of the amorphous silicon layer 120 which corresponds to the substrate 100. The buffer layer 110 may be formed of at least one material selected from the group consisting of silicon oxide, silicon nitride, and silicon oxynitride.

In general, the amorphous silicon layer 120 is formed by chemical vapor deposition (CVD), and the amorphous silicon layer 120 formed by CVD contains a gas such as hydrogen. The gas may cause a problem in that electron mobility may be decreased, and thus, a dehydrogenation process may be performed so as to prevent hydrogen from remaining in the amorphous silicon layer 120. However, the dehydrogenation process is not an essential process and may be omitted. In addition, the amorphous silicon layer 120 may be formed of microcrystalsilicon (i.e. μc-Si) rather than amorphous silicon a-Si.

The amorphous silicon layer 120 becomes the polycrystalline silicon layer 121 via a crystallization process. Since the insulating layer 130 is already formed on the amorphous silicon layer 120, it is advantageous to crystallize the amorphous silicon layer 120 by performing a thermal treatment. For example, a method of crystallizing amorphous silicon as polycrystalline silicon includes a solid phase crystallization (SPC) method, a metal induced crystallization (MIC) method, a super grain silicon (SGS) crystallization method, a Joule-heating induced crystallization (JIC) method, and the like.

However, the crystallization method is not limited to the aforementioned methods and thus one of various methods which are well known in the art may be used.

The SPC method involves annealing a glass for several hours to several tens of hours at a temperature equal to or less than about 700 C.° at which the glass which forms the substrate 100 is deformed. The MIC method uses a phenomenon in which, when metal including nickel, palladium, gold, aluminum and the like contacts the amorphous silicon layer 120 or is implanted into the amorphous silicon layer 120, the amorphous silicon layer 120 is phase-changed as the polycrystalline silicon layer 121. In order to solve a contamination problem of a metal catalyst in a metal induced crystallization method, the SGS crystallization method involves adjusting a size of a crystalline grain containing a metal seed to a level of several micrometers to several hundreds of micrometers by adjusting a concentration of the metal catalyst, which diffuses to the amorphous silicon layer 120, to a low level. In the SGS crystallization, the crystalline grain radially grows with respect to the metal seed, resulting in a crystalline growth direction between adjacent crystalline grains being random.

The JIC method involves forming a conduction layer for Joule heating on or below silicon, and then crystallizing silicon by using heat which is generated when an intensive electric field is momentarily applied to the conduction layer.

The insulating layer 130 functions to protect the amorphous silicon layer 120 from external contamination in a crystallization process of the amorphous silicon layer 120, and functions to protect the polycrystalline silicon layer 121 by preventing the polycrystalline silicon layer 121 from being directly exposed to photoresist (PR) or to an external environment while a patterning process is being performed. The insulating layer 130 may be formed as a single layer or as a plurality of layers, including an inorganic insulating layer such as silicon oxide, silicon nitride or the like.

According to the present embodiment, the buffer layer 110, the amorphous silicon layer 120, and the insulating layer 130 are formed via one process so that the amorphous silicon layer 120 is not exposed to the air while the amorphous silicon layer 120 is crystallized, and thus the amorphous silicon layer 120 is not contaminated. By doing so, a distribution of characteristics of the TFT TR may not occur, and an electric characteristic may be improved.

Figure 2A:
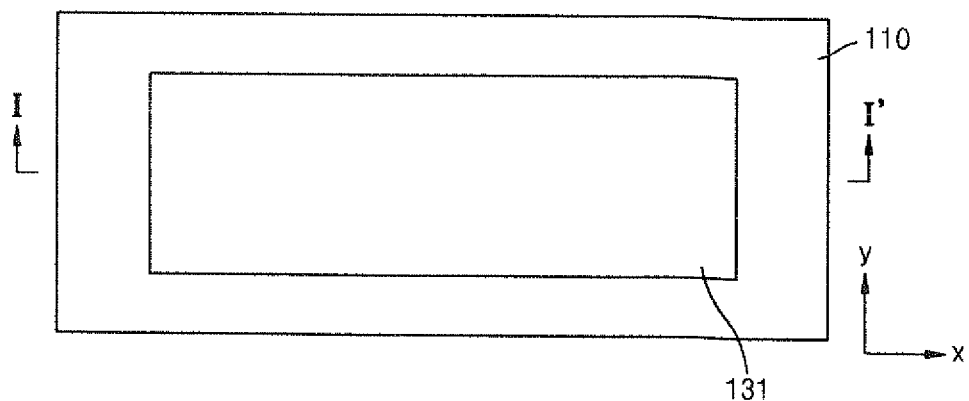
Figure 2B:
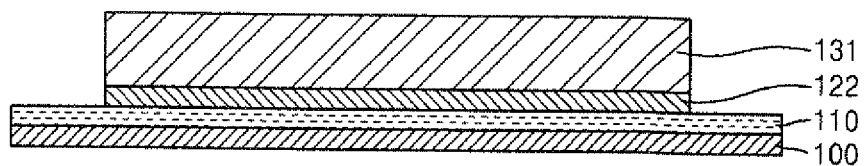

Referring to FIGS. 2A and 2B, the polycrystalline silicon layer 121 and insulating layer 130 of FIG. 1B are simultaneously patterned so that a semiconductor layer 122 and a gate insulating layer 131, which have a predetermined shape, are formed.

In more detail, photoresist is coated on the insulating layer 130 of FIG. 1B. Afterward, an exposing operation is performed by using a photomask having predetermined pattern holes, and then a developing operation is performed, so that the exposed photoresist is removed. Afterward, the polycrystalline silicon layer 121 and the insulating layer 130 are etched so as to have a predetermined shape by using the rest of the photoresist as a mask. By doing so, the semiconductor layer 122 and the gate insulating layer 131 of FIG. 2B are formed. Afterward, the photoresist remaining on the gate insulating layer 131 is removed via an ashing operation or a photoresist stripping operation.

According to the present embodiment, the amorphous silicon layer 120 and the insulating layer 130 of FIG. 1B are formed together via one process so that the photoresist does not directly contact the semiconductor layer 122 (or, the polycrystalline silicon layer 121) of FIG. 2B while the semiconductor layer 122 and the gate insulating layer 131 are formed. Thus, problems of contamination and device characteristic deterioration, which are caused by direct contact between the photoresist and the semiconductor layer 122, do not occur.

Figure 3A:
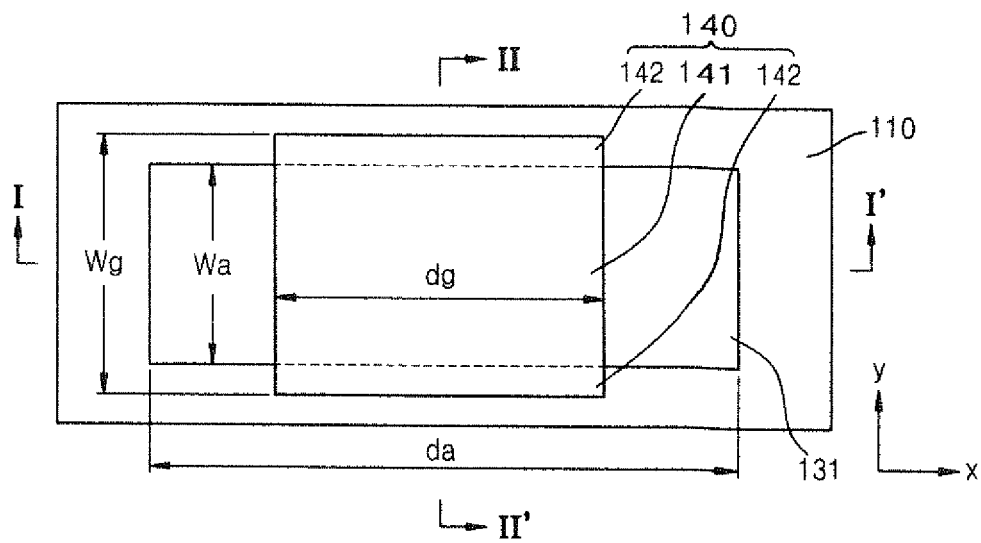
Figure 3B:
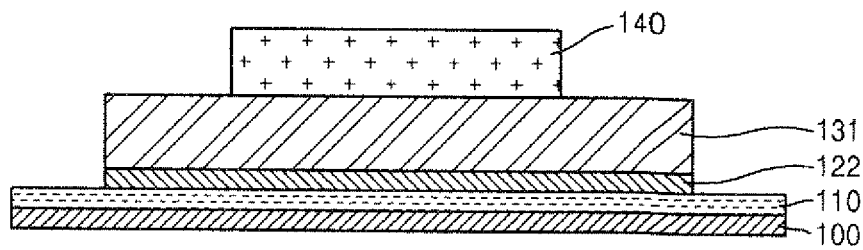
Figure 3C:
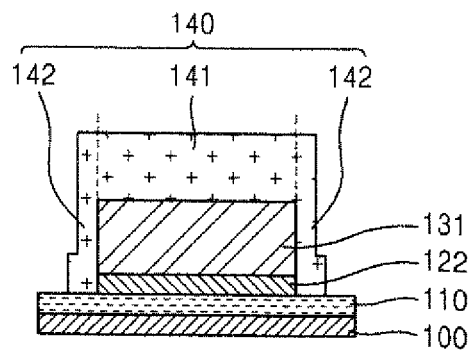

Referring to of FIGS. 3A through 3C, after a metal layer is formed on the gate insulating layer 131, a gate electrode 140 is formed by patterning the metal layer. In this regard, a first width dg of the gate electrode 140 is less than a first width da of the semiconductor layer 122, but a second width wg of the gate electrode 140 is greater than a second width wa of the semiconductor layer 122. Thus, the gate electrode 140 includes a first portion 141 which is formed on the gate insulating layer 131 and which overlaps a channel region of the semiconductor layer 122, and second portions 142 which are formed on the gate insulating layer 131 and which directly contact the semiconductor layer 122. That is, the second portions 142 indicate width portions of the gate electrode 140 which are greater than a width of the semiconductor layer 122 in a direction (that is, a y direction) perpendicular to a movement direction (that is, an x direction) of electrons or holes in the semiconductor layer 122.

FIG. 3B is a cross-sectional view of FIG. 3A, taken along a line I-I' of FIG. 3A. Referring to FIG. 3B, the width of the gate electrode 140 is less than the widths of the gate insulating layer 131 and the semiconductor layer 122. FIG. 3C is a cross-sectional view of FIG. 3A, taken along a line II-II' of FIG. 3A. Referring to FIG. 3C, it is possible to see that the width of the gate electrode 140 is greater than widths of the gate insulating layer 131 and the semiconductor layer 122, and the gate electrode 140 contacts side surfaces of the gate insulating layer 131, and side surfaces of the semiconductor layer 122.

Figure 4A:
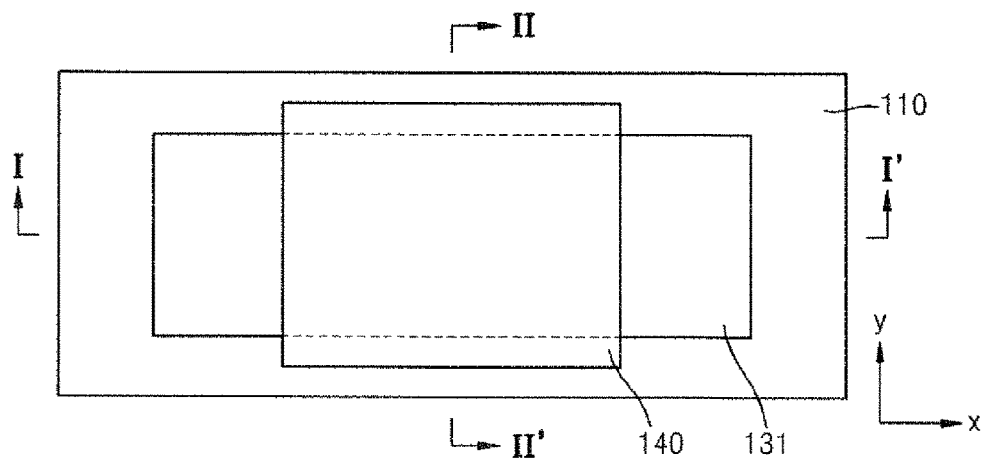
Figure 4B:
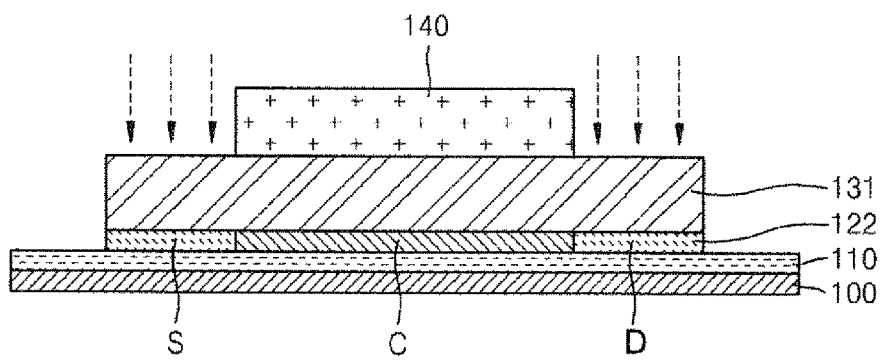
Figure 4C:
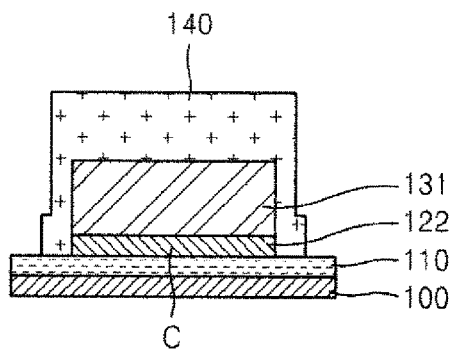

Referring to FIGS. 4A through 4C, a doping operation is performed on the semiconductor layer 122 so that a source region S and a drain region D are formed.

The semiconductor layer 122 may include a channel region C, and the source and drain regions S and D, respectively, which are doped with impurities. The semiconductor layer 122 is doped with an N-type impurity or a P-type impurity by using the gate electrode 140 as a self align mask. The channel region C indicates a region in which the gate electrode 140 overlaps the semiconductor layer 122, and on which the doping operation is not performed. The source and drain regions S and D, respectively, indicate regions in which the gate electrode 140 does not overlap the semiconductor layer 122, and on which the doping operation is performed. Electrons or holes move from the source region S to the drain region D or move from the drain region D to the source region S.

The present embodiment is characterized in that the doping operation is performed only on the source region S and the drain region D since the width portions of the gate electrode 140 are greater than the width of the semiconductor layer 122 in the direction (that is, the y direction) perpendicular to the movement direction (that is, the x direction) of the electrons or the holes in the semiconductor layer 122. In the case where the channel region C is doped with impurities, a characteristic of the device may deteriorate. However, according to the present embodiment, a portion of the width of the gate electrode 140 is greater than the semiconductor layer 122, so that the gate electrode 140 completely covers the semiconductor layer 122, and thus there is no risk that the channel region C is doped with impurities.

Figure 5A:
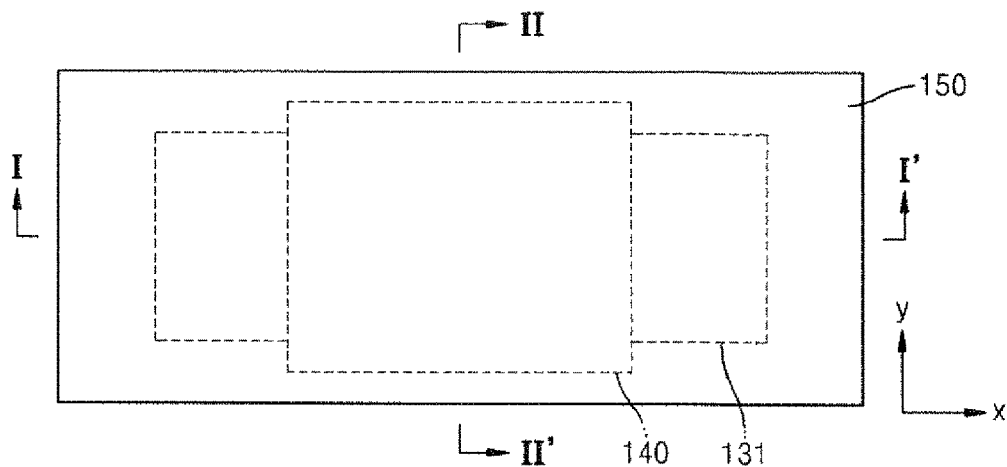
Figure 5B:
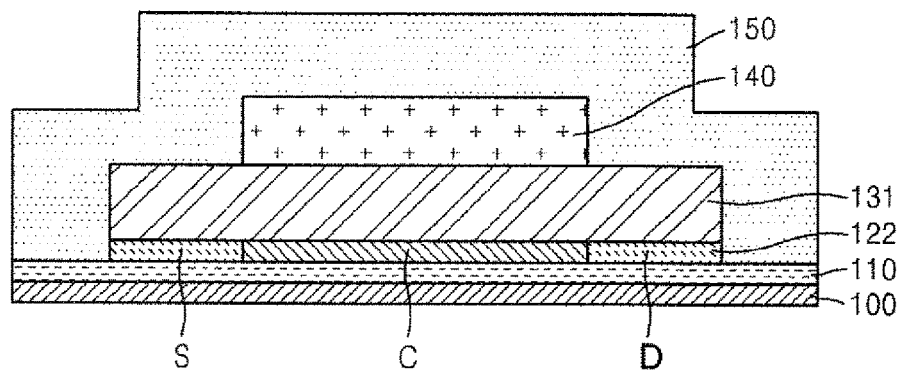
Figure 5C:
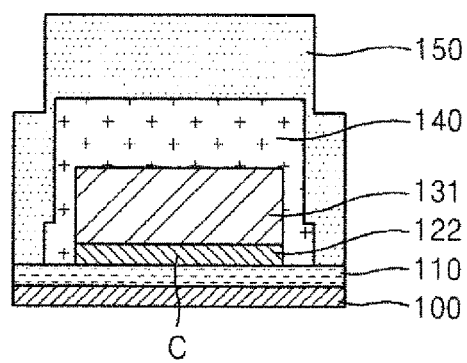

Referring to FIGS. 5A through 5C, an interlayer insulating layer 150 is formed on the gate electrode 140 so as to cover the gate insulating layer 131.

The interlayer insulating layer 150 may be formed as a single layer or as a plurality of layers including an inorganic insulating layer such as silicon oxide, silicon nitride or the like.

Figure 6A:
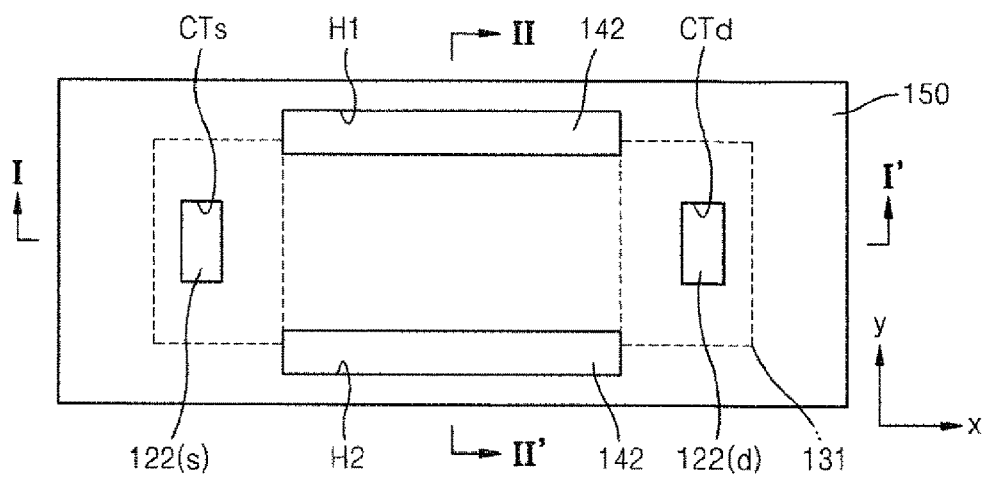
Figure 6B:
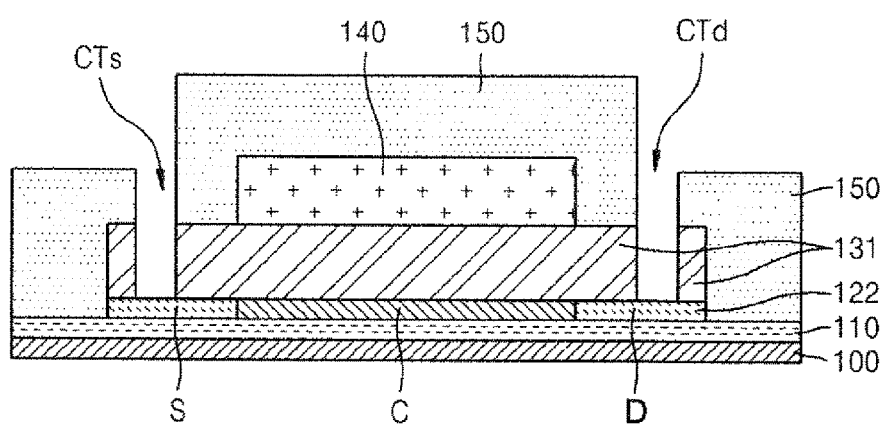
Figure 6C:
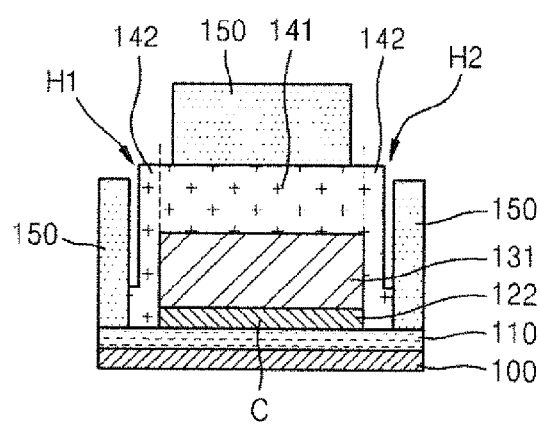

Referring to FIGS. 6A through 6C, contact holes CTs and CTd, and openings H1 and H2, are formed.

The contact holes CTs and CTd are formed in the interlayer insulating layer 150 and the gate insulating layer 131 so as to expose the source region S and the drain region D.

The openings H1 and H2 are formed in the interlayer insulating layer 150 so as to expose the second portions 142 where the gate electrode 140 and the semiconductor layer 122 contact each other. As long as the openings H1 and H2 expose the second portions 142, it does not matter that a portion of the first portion 141 is also exposed.

In order to form the contact holes CTs and CTd, and the openings H1 and H2, an etching solution may be used so as to perform etching on an insulating layer, and the contact holes CTs and CTd and the openings H1 and H2 are simultaneously formed via the same process. In operations illustrated in FIGS. 6A through 6C, a process of forming the contact holes CTs and CTd by removing the insulating layer, and a process of forming the openings H1 and H2 by removing the insulating layer, are simultaneously performed. By doing so, it is possible to decrease the number of manufacturing processes, and to perform patterning of the source electrode 160 (refer to FIGS. 7A through 7C) and the drain electrode 170 (refer to FIGS. 7A through 7C) and removal of the second portions 142 via one process.

Figure 7A:
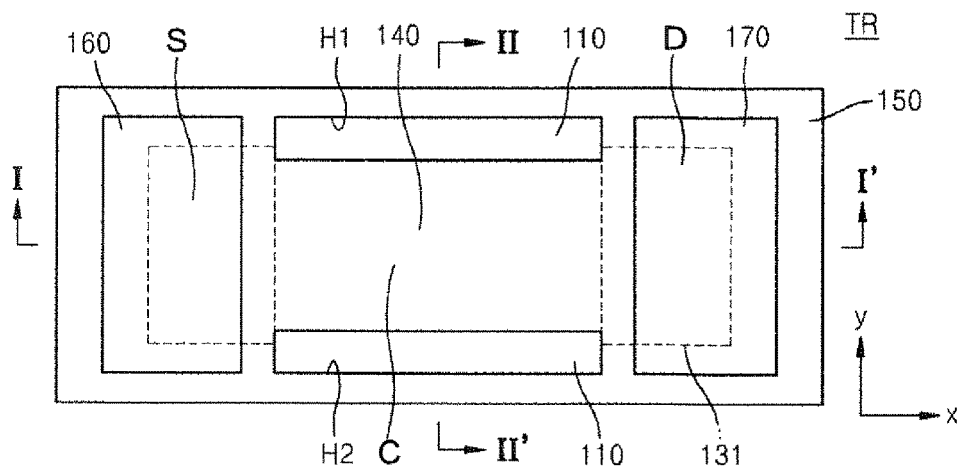
Figure 7B:
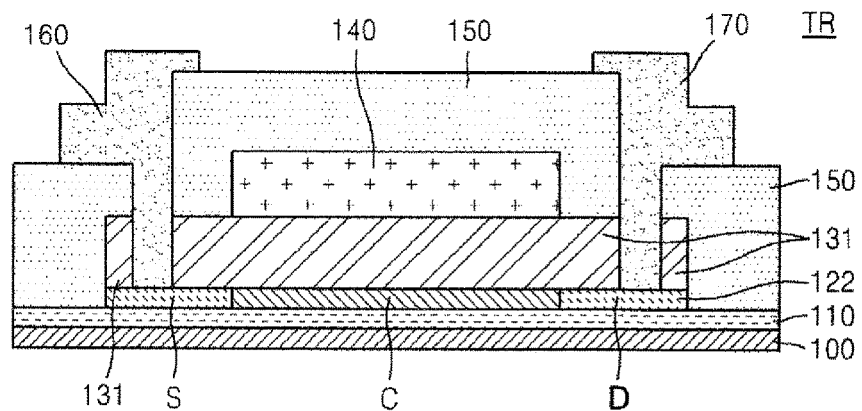
Figure 7C:
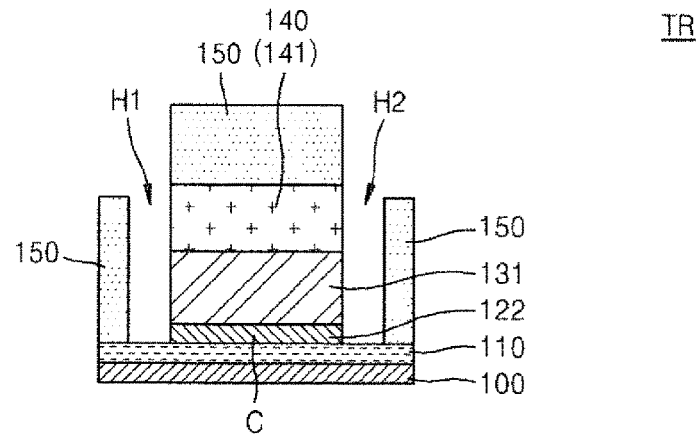

Referring to FIGS. 7A through 7C, the source electrode 160 and the drain electrode 170 are formed, and then the second portions 142, which are exposed via the openings H1 and H2 formed with reference to FIGS. 6A through 6C, are removed.

The source electrode 160 and the drain electrode 170 are formed in such a manner that a conductive layer, which is formed as a single layer or a plurality of layers including a low-resistance metal material, is formed on the interlayer insulating layer 150, and is then patterned. In this regard, the source electrode 160 and the drain electrode 170 are electrically connected to the source region S and the drain region D, respectively, via the contact holes CTs and Ctd, respectively.

The conductive layer for forming the source electrode 160 and the drain electrode 170 may also be stacked in the openings H1 and H2, in addition to the contact holes CTs and CTd, and when the source electrode 160 and the drain electrode 170 are patterned, the conductive layer stacked in the openings H1 and H2 may also be removed. In this regard, since the second portions 142 of the gate electrode 140 which contact the semiconductor layer 122 are formed of a metal material, when the conductive layer stacked in the openings H1 and H2 is removed, the conductive layer stacked in the openings H1 and H2 is also removed.

According to the present embodiment, when the second portions 142 are removed, a portion of the semiconductor layer 122, and a portion of the gate insulating layer 131 which contacts the second portions 142 of the gate electrode 140, may also be removed. In this case, the buffer layer 110 which is disposed below the semiconductor layer 122, and the gate insulating layer 131 which contacts the second portions 142, may be exposed via a region where the second portions 142 and a configuration contacting the second portions 142 have been removed. In the case where the portion of the semiconductor layer 122 and the portion of the gate insulating layer 131 which contact the second portions 142 of the gate electrode 140, are also removed, an etching solution capable of etching not only a metal material but also a semiconductor material and an insulating material may be used.

According to the present embodiment, the second portions 142 of the gate electrode 140, which are largely formed so as to contact the semiconductor layer 122 and to achieve a successful doping operation, are removed so that the possibility of a short circuit between the semiconductor layer 122 and the second portions 142 of the gate electrode 140 is eliminated. By doing so, it is possible to manufacture a TFT having improved reliability.

Referring to FIGS. 7A through 7C, it is possible to see that the semiconductor layer 122 and the gate electrode 140 have particular shapes in a planar view of the TFT TR according to the present embodiment. In more detail, in the semiconductor layer 122, a width of the channel region C with respect to a direction (that is, a y direction) perpendicular to a movement direction (that is, an x direction) of electrons or holes is less than a width of the source region S or a width of the drain region D. That is, the semiconductor layer 122 may have a dumbbell shape. The gate electrode 140 is formed to correspond to the channel region C.

FIGS. 8A through 8C and 9 are cross-sectional views illustrating a method of manufacturing an organic light-emitting display apparatus according to an embodiment of the present invention.

Figure 9:
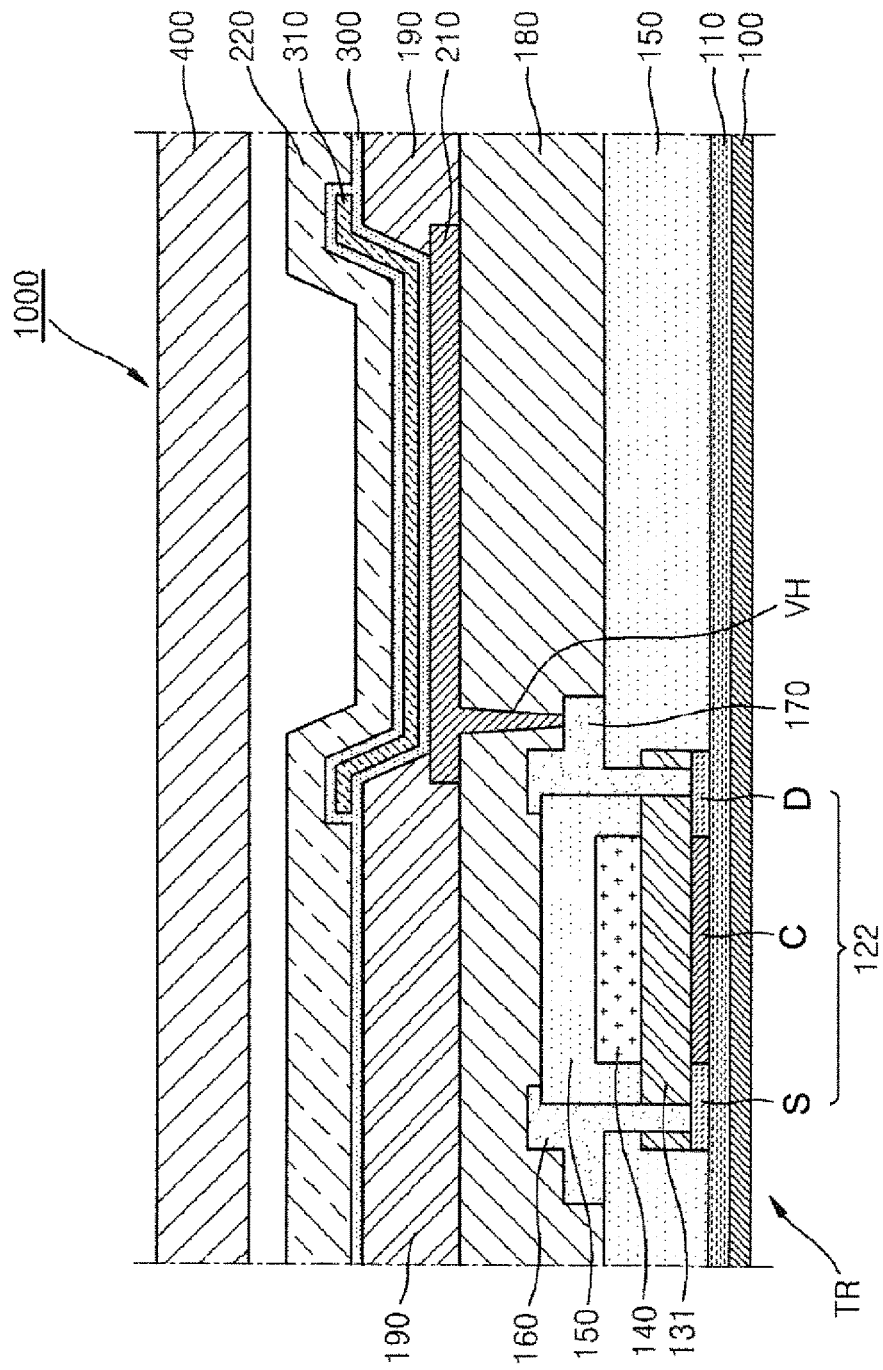

The organic light-emitting display apparatus 1000 of FIG. 9 includes a plurality of pixels, and each of the pixels includes a circuit unit and an emission unit. The circuit unit includes at least one TFT, and the emission unit which is electrically connected to the circuit unit includes an organic light emitting diode (OLED). Further referring to FIG. 9, the OLED may include a pixel electrode 210 functioning as an anode, an opposite electrode 220 functioning as a cathode, and an intermediate layer 300 interposed between the pixel electrode 210 and the opposite electrode 220. However, one or more embodiments are not limited thereto, and thus the pixel electrode 210 may be a cathode and the opposite electrode 220 may be an anode. According to an emission type of organic light-emitting display apparatus 1000, when the organic light-emitting display apparatus 1000 is a top-emission type, the emission unit may be disposed so as to block the circuit unit. When the organic light-emitting display apparatus 1000 is a bottom-emission type or a dual-emission type, the emission unit may be disposed so as not to block the circuit unit.

Since the method of manufacturing the TFT TR included in the organic light-emitting display apparatus 1000 has been described above with reference to FIGS. 1 through 7, hereinafter, only subsequent processes will be further described.

Figure 8A:
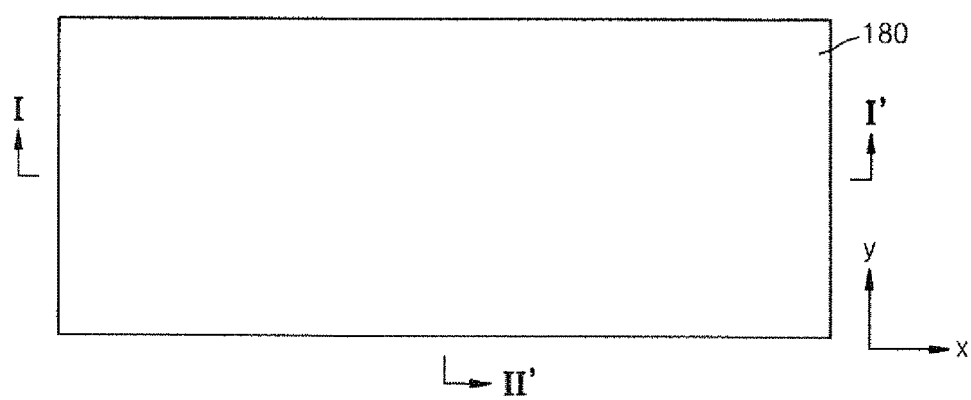
FIGS. 8A through 8C and 9 are cross-sectional views illustrating a method of manufacturing an organic light-emitting display apparatus according to an embodiment of the present invention.
Figure 8B:
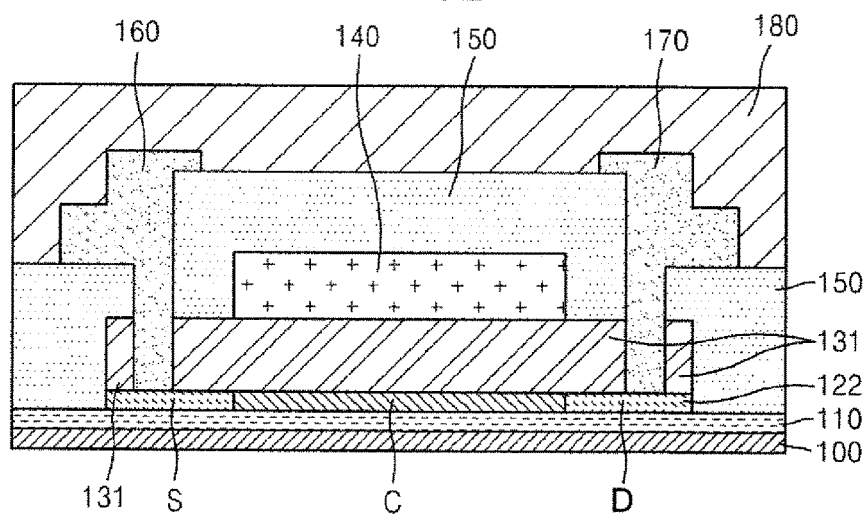
Figure 8C:
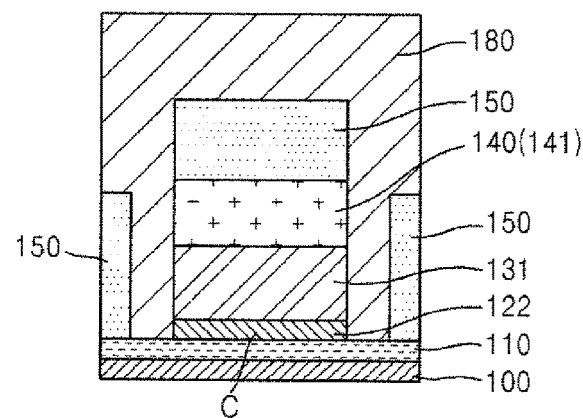

Referring to FIGS. 8A through 8C, a planarization layer 180 is formed on the interlayer insulating layer 150 so as to cover the TFT TR. The planarization layer 180 is also formed on the buffer layer 110 which is exposed via the region where the second portions 142 of FIGS. 6A and 6C have been removed in FIG. 7C. The planarization layer 180 may be a single layer or a plurality of layers, the top surface of which is planarized. The planarization layer 180 may be formed of an inorganic material and/or an organic material. In this manner, an insulating material is filled in the region where the second portions 142 have been removed in FIG. 7C, and thus the structure and the electrical characteristic of the TFT may be stabilized.

Referring to FIG. 9, a via hole VH is formed by penetrating the planarization layer 180 so as to expose the drain electrode 170 of the TFT TR. Via the via hole VH, the TFT TR and the pixel electrode 210 which is formed as a predetermined pattern on the planarization layer 180 are electrically connected.

A pixel defining layer (PDL) 190 is formed on the planarization layer 180 so as to cover side edges of the pixel electrode 210. The PDL 190 functions to define a pixel while the PDL 190 covers the side edges of the pixel electrode 210 by having a predetermined thickness. Also, the PDL 190 functions to prevent occurrence of an arc at an end of the pixel electrode 210 by increasing the distance between the end of the pixel electrode 210 and the opposite electrode 220 (to be described later).

The intermediate layer 300, including an emission layer (EML) 310, and the opposite electrode 220 are sequentially formed on the pixel electrode 210.

The intermediate layer 300 may be formed as a small-molecule organic layer or a polymer organic layer. When the intermediate layer 300 is formed as a small-molecule organic layer, the intermediate layer 300 may have a structure in which a hole injection layer (HIL), a hole transport layer (HTL), the EML 310, an electron transport layer (ETL), an electron injection layer (EIL), or the like are singularly or multiply stacked, and may be formed by using one of various organic materials, including copper phthalocyanine (CuPc), N,N'-Di(naphthalene-1-yl)-N,N'-diphenylbenzidine (NPB), tris-8-hydroxyquinoline aluminum) (Alq3), or the like.

When the intermediate layer 300 is formed as the polymer organic layer, the intermediate layer 300 may include only a HTL toward the pixel electrode 210 with respect to the EML 310. The HTL may be formed by using poly-(2,4)-ethylene-dihydroxy thiophene (PEDOT), polyaniline (PANI), or the like. In this regard, the EML 310 may be formed in each of red, green and blue pixels, and the HIL, the HTL, the ETL and the EIL are common layers, and may be commonly applied to the red, green and blue pixels.

An encapsulation substrate 400 prevents external air and moisture from penetrating into the intermediate layer 300, including the EML 310. Side edges of the substrate 100 and the encapsulation substrate 400 may be combined by an encapsulating member (not shown).

Figure 10:
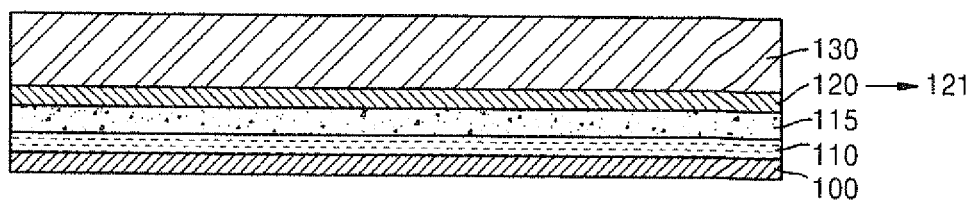
FIG. 10 is a cross-sectional view illustrating a method of manufacturing a TFT in a case where a metal catalyst layer is further formed on a buffer layer according to another embodiment of the present invention.

FIG. 10 is a cross-sectional view illustrating a method of manufacturing a TFT in a case where a metal catalyst layer is further formed on a buffer layer according to another embodiment of the present invention.

Referring to FIG. 10, unlike the embodiment of FIG. 1, the method of FIG. 10 includes a step of forming the buffer layer 110 on the substrate 100 and further includes a step of forming the metal catalyst layer 115 on the buffer layer 110. The amorphous silicon layer 120 and the insulating layer 130 are formed on the metal catalyst layer 115. The metal catalyst layer 115 may be formed of a metal catalyst selected from the group consisting of Ni, Pd, Ti, Ag, Al, Sn, Sb, Cu, Co, Mo, Tr, Ru, Rh, Cd, and Pt, and preferably, the metal catalyst layer 115 may be formed of Ni.

By performing a thermal treatment on the metal catalyst layer 115, the amorphous silicon layer 120 is crystallized as the polycrystalline silicon layer 121.

By performing the thermal treatment, some of the metal catalyst diffuses into the amorphous silicon layer 120, and due to the metal catalyst which reaches the amorphous silicon layer 120, the amorphous silicon layer 120 is crystallized as the polycrystalline silicon layer 121. That is, the metal catalyst is combined with silicon of the amorphous silicon layer 120 so that metal silicide is formed, and then the metal silicide forms a seed which is a core of the crystallization so that the amorphous silicon layer 120 is crystallized as the polycrystalline silicon layer 121.

In the latter regard, the thermal treatment may be performed by using one of various processes including a furnace process, a rapid thermal annealing (RTA) process, an ultraviolet (UV) process, and a laser process.

The thermal treatment may be performed twice, and in this regard, a first thermal treatment process includes a process in which the metal catalyst of the metal catalyst layer 115 moves to an interface of the amorphous silicon layer 120, and then forms the seed, and a second thermal treatment process includes a process in which the amorphous silicon layer 120 is crystallized as the polycrystalline silicon layer 121 due to the seed. In this regard, the first thermal treatment process may be performed at a temperature between about 200 C.° and about 800 C.°, and the second thermal treatment process may be performed at a temperature between about 400 C.° and about 1300 C.°.

Although the organic light-emitting display apparatus is described above as a display apparatus including the TFT according to the present embodiment, one or more embodiments of the present invention are not limited thereto. Thus, one or more embodiments of the present invention may be applied to all types of display apparatuses, including a liquid crystal display (LCD) apparatus.

According to one or more embodiments of the present invention, due to the buffer layer and the insulating layer, the amorphous silicon layer may be crystallized without being exposed to the air, so that contamination may be prevented. Also, due to the insulating layer, the amorphous silicon layer may be patterned without directly contacting photoresist. Accordingly, the TFT may maintain a uniform characteristic so that the electrical characteristic of the TFT may be improved, and the display quality of a display apparatus may be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
   a substrate;
   a buffer layer arranged on the substrate;
   a semiconductor layer arranged on the buffer layer, the semiconductor layer comprising a channel region arranged between a source region and a drain region, wherein a width of the channel region with respect to a first direction perpendicular to a movement direction of one of electrons and holes is less than one of a width of the source region and a width of the drain region;
   a gate insulating layer patterned on the semiconductor layer, wherein, when viewed in a second direction perpendicular to the first direction and the movement direction, contours defining outermost boundaries of the gate insulating layer and the semiconductor layer are equivalent;
   a gate electrode arranged on the gate insulating layer to correspond to the channel region;
   an interlayer insulating layer arranged on the gate insulating layer to cover the gate electrode, the interlayer insulating layer being perforated by openings that are arranged at locations near portions of edges of the semiconductor layer that correspond to the channel region;
   a source electrode and a drain electrode arranged on the interlayer insulating layer and electrically connected to the source region and the drain region, respectively;
   a planarization layer arranged on the interlayer insulating layer to cover the source electrode and the drain electrode and to fill the openings of the interlayer insulating layer;
   a pixel electrode arranged on the planarization layer and electrically connected to one of the source electrode and the drain electrode;
   an intermediate layer arranged on the pixel electrode and comprising an emission layer (EML); and
   an opposite electrode arranged on the intermediate layer.

2. The organic light-emitting display apparatus of claim 1, wherein the buffer layer comprises at least one material selected from a group consisting of silicon oxide, silicon nitride, and silicon oxynitride.

3. The organic light-emitting display apparatus of claim 1, further comprising:
   a pixel defining layer arranged on the planarization layer to cover side edges of the pixel electrode.

4. The organic light-emitting display apparatus of claim 1, wherein:

the openings expose side surfaces of the gate insulating layer, the gate electrode, and the semiconductor layer; and the side surfaces of the gate insulating layer, the gate electrode, and the semiconductor layer that are exposed by the openings are flush with one another.

5. The organic light-emitting display apparatus of claim 1, wherein:

the interlayer insulating layer is further perforated by contact holes exposing the source and drain regions of the semiconductor layer, the contact holes being spaced apart from the openings; and the openings are distinguished from one another and spaced apart from one another.

6. The organic light-emitting display apparatus of claim 1, further comprising a metal catalyst layer arranged between the buffer layer and the semiconductor layer, wherein the metal catalyst layer is comprised of a material selected from a group consisting of Ni, Pd, Ti, Ag, Al, Sn, Sb, Cu, Co, Mo, Tr, Ru, Rh, Cd, and Pt.

7. The organic light-emitting display apparatus of claim 1, wherein each of the openings has a major longitudinal axis and a minor axis, the major longitudinal axis being parallel to a line connecting the source region and the drain region.

8. The organic light-emitting display apparatus of claim 1, wherein each of the semiconductor layer and the gate insulating layer has a dumbbell shape when viewed in the second direction.

\* \* \* \* \*